United States Patent [19]

Henry et al.

[11] 3,940,601

[45] Feb. 24, 1976

[54] APPARATUS FOR LOCATING FAULTS IN A WORKING STORAGE

[76] Inventors: Michel Henry; Gilles Jean Marcel Bottard, both of 94 Avenue Gambetta, Paris (20), France

[22] Filed: Aug. 30, 1974

[21] Appl. No.: 502,165

[30] Foreign Application Priority Data
Sept. 5, 1973 France .................. 73.32062

[52] U.S. Cl. ........................................ 235/153 AC
[51] Int. Cl.² .................. G06F 11/00; G11C 29/00
[58] Field of Search .............. 235/153 AC; 340/172.5

[56] References Cited
UNITED STATES PATENTS

| | | | |
|---|---|---|---|
| 3,581,074 | 5/1971 | Waltz ........................ | 235/153 AC |
| 3,633,016 | 1/1972 | Walker et al ................ | 235/153 AC |
| 3,714,403 | 1/1973 | Ammann et al ............. | 235/153 AC |
| 3,719,929 | 3/1973 | Fay et al ..................... | 340/172.5 |
| 3,751,649 | 8/1973 | Hart, Jr ....................... | 235/153 AC |
| 3,790,885 | 2/1974 | James ......................... | 235/153 AC |
| 3,810,577 | 5/1974 | Drescher et al ............. | 235/153 AC |
| 3,832,535 | 8/1974 | De Vito ...................... | 235/153 AC |

Primary Examiner—Charles E. Atkinson

[57] ABSTRACT

The disclosure describes a device for locating faults in a working storage arranged in rows and columns.

The device includes an auxiliary storage which holds a sequence of test words and means for cyclically writing the test words into the working storage and reading the test words out of the working storage. A bit for bit word comparator compares the words read out of the working storage with the words read into the working storage and detects bits of the words which do not match in order to identify defective components. First and second registers record the row and the column to which the defective component belongs.

8 Claims, 7 Drawing Figures

Fig. 2.
| Bit N° | 1 2 3 4 5 6 7 8 | 9 | 10 11 12 13 14 15 16 17 | 18 |
|---|---|---|---|---|
| MD | First Byte | I | Second Byte | II |
| MT1 | 1 1 0 0 1 1 0 0 | 0 | 1 1 0 0 1 1 0 0 | 0 |
| MT2 | 0 1 1 0 0 1 1 0 | 0 | 0 1 1 0 0 1 1 0 | 0 |
| MT3 | 1 0 1 1 0 0 1 1 | 1 | 1 0 1 1 0 0 1 1 | 1 |
| MT0 | 0 0 0 0 0 0 0 0 | 0 | 0 0 0 0 0 0 0 0 | 0 |
S ↓ (indicates MT1, MT2, MT3 direction)
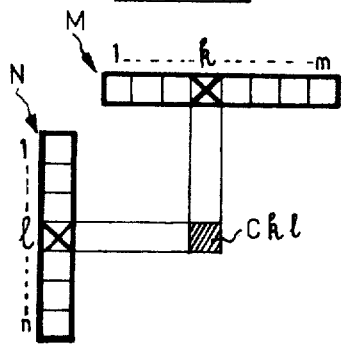
Fig. 4.
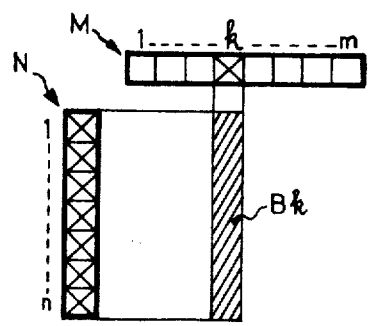
Fig. 5.
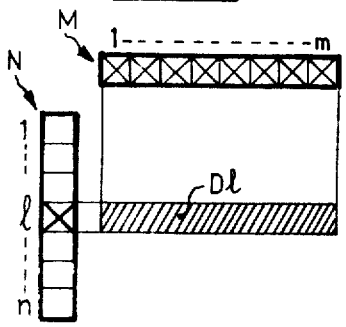
Fig. 6.
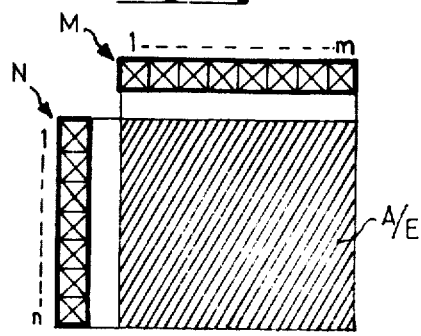
Fig. 7.

APPARATUS FOR LOCATING FAULTS IN A WORKING STORAGE

RELATED APPLICATION

Priority is claimed under French Patent Application Ser. No. 73,32062, filed Sept. 5, 1973.

BACKGROUND OF THE INVENTION

The invention relates in a general way to the construction, operation and maintenance of working storages incorporated into data processing systems and concerns more specially a device for locating faults in such storage.

Working stores, that is stores in which data can be written in or read out at will, constitute an essential element of data processing systems. In a great measure, working stores determine not only the capacity but also the speed and reliability of such systems. Up to the present, these working stores generally have consisted of magnetic toroidal cores arranged at the nodes of a matrix array and linked with addressing circuits, as well as circuits for writing in and reading out data. Since each core can only store one bit of information, the capacity of the storage was directly related to the number of cores it contained; hence, a large capacity store had a great number of cores and circuits. Such a store was difficult and costly to manufacture, because the cores were made as small as possible in order to reduce the size and increase the operating speed of the storage.

In order to overcome the drawbacks of magnetic toroidal core storages, it was suggested to make working stores using discrete active components, such as transistors. This solution led to very complex cabling and to a large power requirement without appreciable gains in overall size and speed. Discrete active components were rapidly superseded by integrated circuits and particularly monolithic large scale integrated circuits, each one of which comprises on a minute chip a large number of active components and hence of storage locations, as well as internal routine and operating circuits which considerably reduce the number of external connections. For example, an integrated circuit currently used for the construction of working stores and comprising 1024 locations comes in the shape of a silicon chip of a few square millimeters area sealed into a flat case not longer than 2 cm and provided with less than 20 external connections; because of the compactness of such integrated circuits, their operation is extremely fast and allows access to any storage location within a fraction of a microsecond; furthermore because a small number of connections gives access to very many locations, a large capacity storage can be easily made up by using several identical integrated circuits mounted on a printed board of small size and of relatively simple layout. This solution has, notably, the advantage of allowing the easy exchange of any defective integrated circuit. Due to their intrinsic complexity and difficult manufacturing, large scale integrated circuits, including MOS type (Metal Oxide Silicon) circuits, are subject to faults liable to detrimentally affect the operation of working stores incorporating such circuits. It is therefore important to provide a technique for identifying with ease the location of any faulty storage position and the location of the corresponding integrated circuit in order to replace the component.

The invention has as one object an arrangement for locating faults in a working storage essentially made up of identical interchangeable components, such as MOS type integrated circuits, each having several addressable locations at which at least one bit of data can be stored.

In accordance with a known and preferred layout, the components of such a storage are arranged in a matrix form in which the components of a same column correspond to a same block and those of a same row to a same data bit or group of data bits; in a corollary way the store possesses facilities for addressing simultaneously locations of a same address of all the components, circuits for the simultaneous validation of the components of a same block, parallel data input and output circuits connected respectively to storage locations corresponding to a same bit of the components of every row and facilities for selectively operating the writing or reading of a word at the specified address of the components of the validated block.

SUMMARY OF THE INVENTION

According to one feature of the invention capable of locating faults in a working storage of the type specified, an auxiliary permanent storage holds a sequence of test words each comprising as many bits as a storage word and between which both logic states are distributed in such a way that each bit presents each state at least once in the sequence. Auxiliary circuitry writes this sequence of test words in the working storage, repeated as often as necessary in order to fill all addresses of one block. The content of each address of the block is then read out and compared to the corresponding test word in order to point out, if need be, the position of any pair of bits at variance and the row of the defective component creating the bits at variance. These operations are repeated for the one block with cyclic permutation of the test words in the sequence up to their original rowing, so as to test all the locations of each address of said block for both logic states and thus identify all the defective components in the the relevant column.

If the storage consists of more than the one block, a neutral word can be written into the remaining blocks. Then the whole of the foregoing procedure is carried out for each block of the storage in order to locate all the components and/or circuits that are defective.

It is thus seen that by the use of a simple repetitive procedure and features easily incorporated in a working storage, the invention does locate all the possible faults of such storage, whether of its components and/or its connecting circuits.

At the end of the aforementioned procedure, the invention can produce a list of all defective components each one located by the position of the row and the column to which it belongs. Faulty circuits also are identified by the distribution of the components apparently defective, that is by all the components of the matrix if it concerns addressing circuits or writing instruction circuits, by all the components of a same column if it concerns the corresponding validating circuit and finally by all the components of a same row if it concerns corresponding data input or output circuits.

BRIEF DESCRIPTION OF THE DRAWINGS

Other characteristics and advantages of the invention will become clearer after reading the detailed description which follows and which refers to the appended drawings in which:

FIG. 2 is a table showing the format of a data word, a sequence of test words according to the invention and a neutral word;

FIGS. 4 to 7 are diagrams showing the diagnosis of different types of faults.

DESCRIPTION OF THE PREFERRED EMBODIMENT

Figure 1:
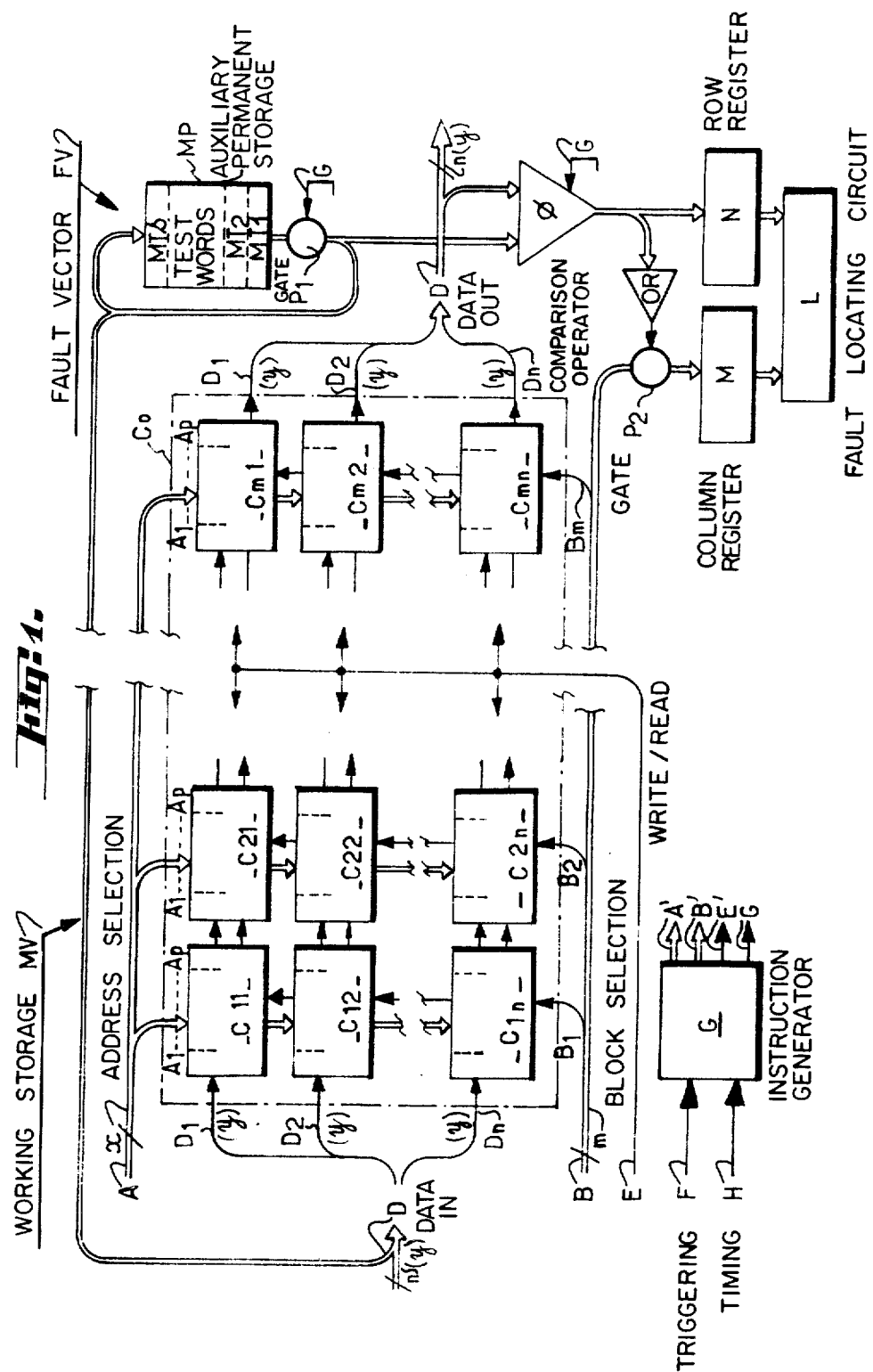
FIG. 1 is a block diagram of an exemplary working storage in question provided with a preferred form of the present invention for locating faults in the storage.

On FIG. 1 is shown a working storage MV and also an associated device called "Fault Vector" FV for eventually locating the faults of said storage.

The working storage is mounted on a wiring carrier Co, such as a printed circuit board or a thin or thick film module. The storage has a plurality of identical components Cll...Cmn, each of which is made up of a large scale integrated circuit chip either mounted bare and uncovered on the wiring carrier Co or enclosed in a protective and terminal case joined to the carrier. Both mountings permit the individual replacement of components. As shown by FIG. 1, components Cll...Cmn are laid out on the wiring carrier Co in a matrix array formed by rows and columns, the two indices attached to each component identifying respectively the column (1....m) and the row (1....n) to which it belongs.

Each of the components Cll...Cmn is a large scale integrated circuit, preferably MOS (Metal Oxide Silicon) for well known reasons. Each of these components has several addresses Al...Ap, each corresponding to at least one store cell capable of storing one data bit; for ease of description, it will be assumed here that each component has $p = 2$ addresses (1024 for example) each corresponding to a store cell. Consequently, each component has x addressing inputs, one data input and one data output, as well as the usual connections for supply, validation, inhibiting and read/write selection.

In these conditions, access to a given store location of any one of components Cll....Cmn can be achieved by means of an addressing bunch A comprising $x$ conductors, each one of which is connected to the addressing inputs of the same rank of every component. This access, however, is effective only for the specified address of the components of a same column whose validation inputs are connected to one of the $m$ conductors of a validation bunch B. This is, the components of a same column constitute a block, of which each one of the $p$ addresses has $n$ positions and can have written in or read out a word of $n$ bits, respectively loaded or read in parallel by means of data input and output bunches D having $n$ conductors. The selection write/read is carried out by means of a writing validation conductor E connected to the corresponding input of each of components Cll...Cmn.

The operation of the working storage MV which has just been described is as follows:

Access to a given address Aj of a given block Bk is obtained on the one hand by putting the $x$ conductors of addressing bunch A into respective logic states whose combination corresponds to the said address and on the other hand by energizing the validation conductor of bunch B corresponding to the block. Hence if a word must be written into the selected address of the working storage MV, the writing validation circuit E is energized and the $n$ bits of the word to be written are loaded in parallel to the corresponding locations of the specified address by the $n$ conductors of the input data bunch D; inversely, to read out a word that had first been loaded in the selected address, the validation circuit is left in the quiescent state and the $n$ bits of the word to be read are extracted in parallel by the $n$ conductors of the data output bunch D. Of course these operations are carried out under the control of a control unit (not shown) connected to the addressing bunch A and validation bunch B, as well as the writing selecting circuit E. The data input and output bunches D are connected to external registers (not shown).

Before describing the fault locating device or Fault Vector FV, it is advisable to analyze the defects or faults that could arise in working store MV and to establish the procedure enabling them to be located.

A defective store cell or circuit can either remain permanently in one or the other of the logic states 0, 1, or it could be "tied" to another variable, for example, because of a spurious coupling. During the operation of the store, any internal fault of a component or any fault which affects that component alone (for example a circuit interrupted on one of its terminals) results in anomalies in the data circuits DI corresponding to the row to which the faulty component belongs when block $B_k$ corresponds to the column to which that same component belongs is brought into play. Depending on the nature of the fault, these anomalies can occur when data is read out of one, several or all of the addresses AJ. Similarly, if each component had at each of its addresses not one but several (y) store cells, the anomalies could appear on one of several of the y rows of corresponding bits. However, these considerations are unimportant as far as the implementation of the invention is concerned, for which it is sufficient to determine the row and column of the matrix to which the defective components to be changed belong. If the number of store cells or of faulty circuits in a component is thus immaterial, it is important on the other hand to check that each of these cells can correctly store and give back a data bit for both binary logic states; the necessity for this double check has consequences that will be described hereafter.

Apart from individual component faults, the working store MV can display wiring faults either internal or external to the component matrix, but which all give rise during operation to anomalies affecting several components: thus when anomalies affect one specific bit on all the blocks, the fault concerns the corresponding data row Dl....Dn; inversely, if the anomalies affect all the bits of a single block, the fault concerns the validation row Bl...Bm of that block; finally, anomalies affecting all the bits of all the blocks give rise to a fault concerning either the addressing bunch or else the validation circuit for writing.

As already mentioned, satisfactory location of faults of the working storage MV implies that each store cell must be checked for both logic states 0 and 1. For so doing, in accordance with the invention, one writes successively in each address of the store several test words each one of which has as many bits as a store word and between which the two logic states 0 and 1 are distributed in such a way that each bit has assumed at least once each state when all the test words have been written. After anyone test word is written in a specific address, the contents of that address is read and compared bit for bit to the original test word. Any discrepancy between the bit written in and the bit read out is detected to indicate a fault of the corresponding store cell; when this procedure has been repeated for each of the test words, it is certain that all the store cells of the address in question have been checked for both logic states and therefore that all the defective cells of that address have been brought to light.

The implementation of this process raises two problems, namely on the one hand the definition of the set of test words satisfying the criteria mentioned above and on the other hand the definition of a procedure to detect and locate addressing faults by means given in the detailed description that follows. In accordance with the preferred embodiment of the invention, these two problems will be jointly resolved on the one hand through the use of a sequence of test words put in a specific order satisfying the criteria mentioned above and on the other hand through the use of a test procedure which essentially consists of: writing the sequence, repeated as many times as necessary, into the successive addresses of a same block; starting again that operation for the same block with a cyclic permutation of the test words in the sequence until they return to their initial order; and reproducing the whole of this process for each of the storage blocks. Each writing in of test words at all the addresses is followed by the reading out of the content of each of these addresses for its comparison with the corresponding test word.

The test words format corresponds to the format of the store words. In the case shown in FIG. 2, in which the data words MD processed by the working storage MV have two bytes each, with a parity bit, that is a total of 18 bits, the test words MT also have 18 bits. For each of these bits to assume at least once each logic state, it would appear that the use of whatever test word and of its complement would suffice; however, since the inversion of a word having an even number of bits does not alter its parity bit, three test words MT1-3 are, in fact, necessary. Except for having to satisfy the above condition, these test words could have several structures and could be arranged in arbitrary order; however, their structure and their sequence are chosen so that after they are written in consecutive addresses, the sequence S of the three test words MT1-3 on the table of FIG. 2 meets these various conditions.

The number of test words, at least equal to three for reasons mentioned above, must satisfy an extra condition in order to be able to detact addressing faults. In case of a fault affecting addressing circuit, those addresses being effectively reached differ from the prescribed addresses by a value equal to a power of 2, i.e. to the "weight" of the corresponding address position; it is therefore necessary to write different test words in addresses distant from each other by whatever power of 2, but, of course, smaller than the total number of addresses. Because of the cyclic writing of the test words (repetition of the sequence) in the successive addresses of the block tested and taking into account the subsequent circular permutation of these test words, the last mentioned condition is satisfied if the number of test words of the sequence is different from all powers of 2 smaller than the total number of addresses. It means that for these reasons also, the sequence must have at least three test words.

Finally, to avoid any interference on the circuits of the store data locations belonging to all the blocks other than the one tested, it is preferable to load all the addresses of all these blocks with a neutral word MTO corresponding to the combination of the logic state of the data output circuits when quiescent, namely, 18 bits in the 0 state, in the example shown in FIG. 2.

After having briefly described the proposed test procedure, an example will now be described of the means used to implement it, that is the fault locating device or Fault Vector shown in FIG. 1.

This device comprises essentially one auxiliary storage, advantageously made up of a permanent storage MP holding the test words sequence MT1...Mts. Associated circuitary including gate, P1 as well as shift and buffer registers (not shown) enable the cyclic reading of these words from any predetermined rank and their dispatch on the one hand to the data input circuits D of the working storage MV for writing in said storage and on the other hand to one of the sets of inputs of a comparison operator $\phi$. An other set of inputs to operator $\phi$ is connected to the data output circuits D of the working storage MV. Operator $\phi$ ensures the bit for bit comparison of each test word previously written in a specific address of the working storage MV with the word thereafter read at that same store address. Operator $\phi$ generates an output signal having as many bits as the test words, normally all held in a normal logic state. However, if a bit of a word read in the permanent storage MP differs from the corresponding bit of the same word as previously written and then read in the working storage MV, the bit of like rank in the output signal of comparison operator 0 is switched to the state opposite the normal state. This output signal is applied to the inputs of a register N whose state identifies the rank of the differing or clashing bits and therefore the rank of the corresponding row of components. The output signal also is applied to a multiple OR gate which operates gate circuits P2 that respectively control the connection of each of and thereby the column conductors B1...Bm to a corresponding position of a register M. Consequently, the state of register M identifies the block and thereby the column containing a component recognized as defective by operator. Registers M and N are linked with locating circuits L (including for instance a sequential printer) which establish the list of components found defective in the course of the test procedure. The said auxiliary storage and related devices and circuitry for carrying out the test procedure are operated either by the control unit of the data processing system adequately programmed for this purpose or else by a special, e.g. microprogrammed instruction generator G put into operation by a special triggering or enable signal F. Under the control of clock signals H, said control unit or generator G supplies all the instructions required for the sequential access to successive addresses of each of the blocks of the working storage MV, the cyclic reading of the test words in the permanent auxilliary storage MP, the selection of write or read operations of the working storage and the operation of the gate circuits P1 and other devices associated with the permanent storage, as well as the comparison operator 0, the registers M, N, the gate circuits P2 and the locating circuits L.

Figure 3:
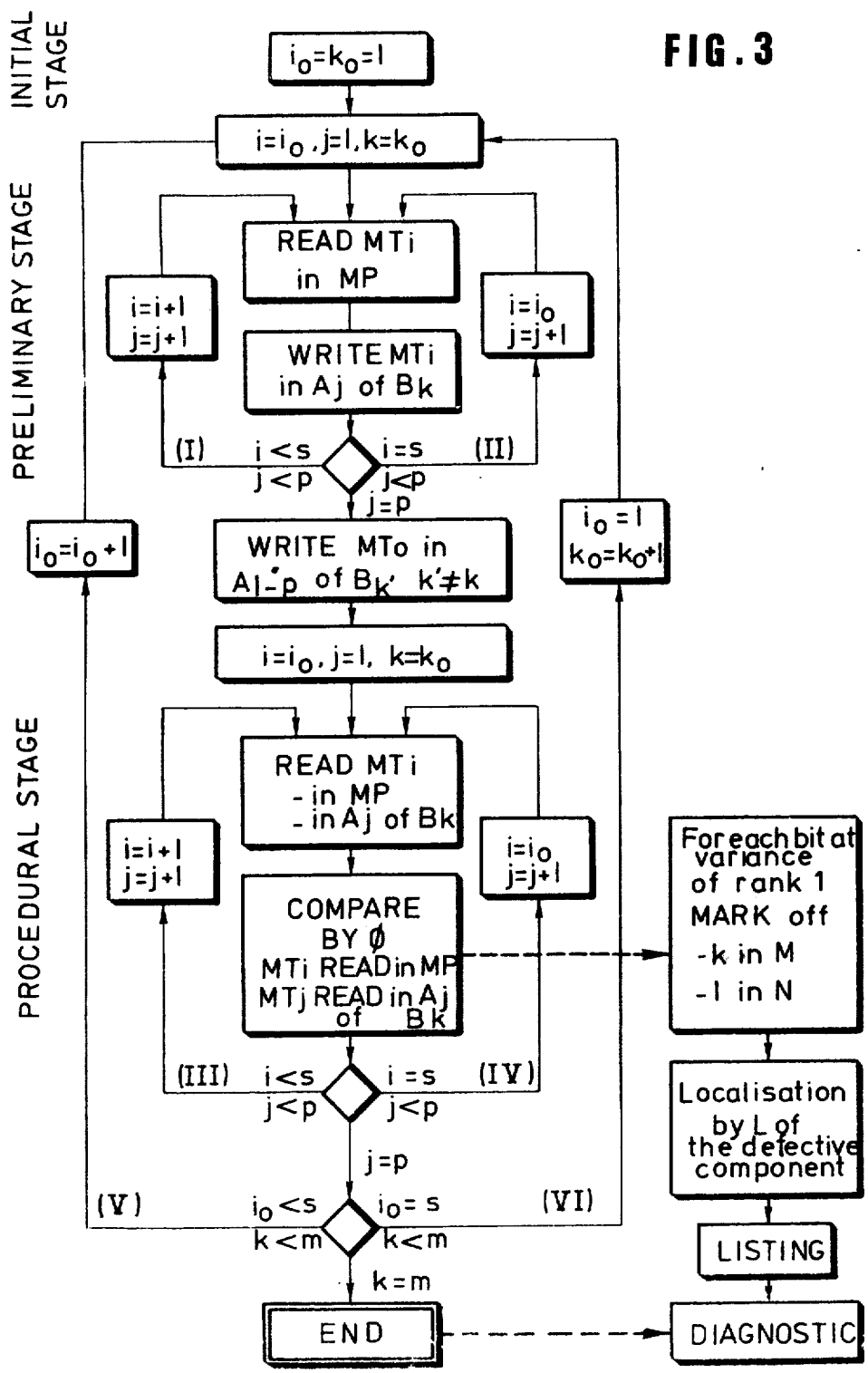
FIG. 3 is a flow chart of the operation of the fault location device of FIG. 1.

The set of instructions required therefor will appear clearly from the following description of the flow-chart of FIG. 3:

The combined operation of the working storage MV and of the fault locating device FV is shown in the flow-chart of FIG. 3. In that flow chart, a test word is designated by MTi, $i$ varying from 1 to $s$, the total number of words in the sequence; similarly Aj designates any of the addresses A1...p of a block bk corresponding to any one of the $m$ columns of components, whereas Dl designates a data bit or group of data bits corresponding to any one of the $n$ rows of components.

As shown at the start of the test procedure, it will be assumed that indices $i, j, k$ have initial values $i_o = 1, j_o = 1, k_o = 1$. Under these conditions the reading of the flow-chart shows that during a first, preliminary step, the test word MT1 read in the permanent storage MP is simultaneously written in the first address A1 of first block B1 of the working storage MV. Then indices $i$ and $j$ are increased simultaneously by one (loop I) which triggers the reading of the second test word MT2 in the permanent storage MP and its writing in the second address A2 of the first block B1 of the working storage. This procedure is repeated by simultaneously increasing indices $i$ and $j$ (in loop I) until the sequence of test words MT1-MTs is exhausted; each of these test words is then written in the address with rank A1-As corresponding to the first block B1 of the working storage.

When the sequence of test words is thus exhausted, ($i = s$), this index is brought back to its initial value $i_o = 1$ whereas index $j$ is increased by one (loop II). So, the test words sequence MT1-MTs is read again in the permanent storage MP and written in the consecutive addresses As+1−A2s of the first block B1 of the working storage MV by loop I. The preliminary stage is pursued by repetition of these procedures through the interplay of loops I and II, which ensures the writing of sequences of test words MT1-MTs in the consecutive addresses of the first block B1 of the working storage MV repeated as many times as necessary to exhaust all the addresses of said block ($j=p$). The preliminary stage is ended by writing in the other blocks of the nuetral word MT0.

At the end of this preliminary stage starts a procedural stage, with indices $i$ and $j$ being brought back to their initial values, $i_o$ and $j_o = 1$ respectively. During this procedural stage, by the interplay of loops III and IV, which operate respectively which operate like the loops I and II, the content of each of consecutive addresses A1-Ap of block B1 of the working storage MV is read and compared by operator to $\phi$ corresonding test word MTi written at this same address during the preliminary stage and which is read again in the permanent storage MP. When there are two clashing or differing bits of the same rank in a word read in working storage and in the corresponding test word as pointed out by the operator $\phi$, the rank I of these bits is marked off by register N and the rank $k$ of the block concerned is marked off simultaneously by register M, that is to say the first block rank, at this stage in the test procedure.

When all the addresses of the first block have been tested ($j = p$), the preliminary stage is restarted, by the loop V. The beginning initial conditions are restored, except that the initial value $i_o$ is incremented by 1. During a second preliminary stage, the sequence of test words read from the second word, i.e., MT2...MTs−MT1, is cyclically written at the consecutive addresses A1-Ap of the same block B1 as before. Then, during a second procedural stage, the content of each address is compared to the corresponding test word by the operator $\phi$, any variance being indicated by registers M and N as before. At the end of this second procedural stage, loop V restarts a new preliminary stage-procedural stage cycle after a new incrementation by one of the initial value $io$ of indice $i$, causing a new cyclic permutation of the test words. The sequence now become MT3....MTs−MT1−MT2.

The whole of the procedure described is repeated through the intervention of loop V until all the test words have taken the first position in the sequence ($iO = s$) successively. In this way, each of the addresses A1-Ap of the first block B1 have been tested successively by each of the test words, and it is possible to detect all the eventual faults of the block components. Then, the following block can be tested, with the indices $i$ and $j$ brought back to their initial values and indice $k$ increased by one through the intervention of loop VI.

When all the blocks have been tested in this way ($k = m$), the test procedure has ended, and it is possible to set up the diagnostic of the eventual faults of the working storage MV from the listing set up by the locating circuits L linked to registers M and N.

This diagnostic can be carried out very simply as shown symbolically by the diagrams of FIGS. 4 to 7.

As shown in FIG. 4, if only one component Ck1 of the working storage is faulty, registers M and N, respectively, display the rank $k$ of the column and the rank $l$ of the row to which the defective component Ck1 belongs. In order to take into account the possibility of internal faults individually concerning several components, the listing must be carried out block by block.

In the case shown in FIG. 5 in which all the components of a single block of rank k behave abnormally, the cause of the fail lies in the corresponding block validation circuit Bk. Inversely, as shown in FIG. 6, if all components of a single row $l$ behave abnormally, the cause of the fault lies in the data input or output circuits corresponding to row $D_l$.

Finally, if all the components of the matrix show an abnormal behavior, as shown in FIG. 7, the fault is due either to the addressing circuits A or to the write/read selecting circuit E.

Apparatus made in accordance with the invention facilitates the location of eventual faults in a working storage using equipment of little complexity which is easy to operate. The equipment will work either independently or under the control of the operating units of the processing system which incorporates the store being tested.

The invention is in no way limited to the methods of implementation and apparatus described and shown which were only given as an example; on the contrary, the invention includes all the means forming technical equivalents to those described and illustrated taken separately or in combination and implemented within the framework of the claims that follow.

What is claimed is:

1. In a data processing system including a working storage consisting essentially in a plurality of identical components each having several selectively addressable store cells at which at least one bit of a data can be stored, said components being arranged in a matrix array wherein each column constitutes a block capable of storing several data words at respective addresses and wherein each row corresponds to at least one and the same bit position of said words, said working storage being further provided with circuit means operative for selectively writing or reading a data word at any predetermined address of any one of said blocks, a method for locating faults in said working storage, which comprises the preliminary step of determining a sequence of at least three test words each having as many bits as a data word and between which both logic states are distributed so that each bit presents each state at least once in said sequence, and which further comprises the operating steps of:
- writing repetitively said sequence of test words at successive addresses of a first one of said blocks until all addresses thereof are filled, then reading out successively the content of each address of said first block and comparing same to that test word previously written at the said address, and whether any corresponding bits thereof differ, determining the position of said differing bits and registering the row of the involved defective component;
- then repeating for said first block the aforesaid operating step with cyclic permutation of said test words in said sequence up to their initial ranking, to thereby register the rows of every defective components in said first block, and further registering together the relevant column;
- and thereafter repeating the aforesaid steps for each block of said working storage, to thereby list every defective component thereof, each one being identified by the row and column to which it pertains.

2. Method according to claim 1, wherein the number of said test words in said sequence differs from any power of 2 smaller than the number of addresses of a component or block.

3. Method according to claim 1, comprising the additional step of:
- writing a neutral word at all addresses of every blocks of said working storage other that under test, said neutral word having as many bits as a data word, which are all in the same logic state.

4. Method according to claim 1, comprising the supplementary step of identifying any faulty aforesaid circuit means of said working storage, from a consideration of the distribution of said defective components thereof as listed involving at least one full row and/or column of said matrix array, or the whole array.

5. In a data processing system including a working storage consisting essentially in a plurality of identical components each having several selectively addressable store cells at which at least one bit of data can be stored, said components being arranged in a matrix array wherein each column constitute a block capable of storing several data words at respective addresses and wherein each row corresponds to at least one and the same bit position of said words, said working storage being further provided with addressing circuits operatively connected to all aforesaid components of said matrix array for enabling a determined address thereof, with validating circuits operatively and respectively connected to all aforesaid components pertaining to a same column for enabling the corresponding block, with data in and data out circuits operatively and respectively connected to all aforesaid components pertaining to a same row for writing and reading data at the relevant bit positions, and with write/read selection circuits operatively connected to all aforesaid components for controlling selective writing or reading of a data word at the enabled address of the enabled block, an apparatus for detecting faults in said working storage, which comprises:
- an auxiliary storage containing a sequence of at least three test words each having as many bits as a data word and between which both logic states are distributed so that each bit presents each state at least once in said sequence, and auxiliary means associated thereto for cyclically reading out said sequence from any specified test word thereof, said auxiliary means being operatively connected to said data in circuits of said working storage;
- comparison means having two sets of inputs respectively connected to said data out circuits of said working storage and to said auxiliary means, said comparison means being operative for comparing each bit of the content read out at a determined address of said working storage with the corresponding bit of that test word previously written at the said address, and for producing an output signal identifying the position of any differing bits;
- row registering means operatively coupled to said comparison means to receive said output signal and to register the row of the involved defective component of said working storage;
- column registering means operatively coupled to said block validating circuits of said working storage through gate means operated by said row registering means to register the column of said defective component;
- localization means operatively coupled to said row and column registering means for listing every defective components of said working storage;
- and control means for coordinating the operation of said working storage, auxiliary storage and aforesaid means, so that every addresses of every blocks of said working storage are successively tested with every test words of said auxiliary storage.

6. Apparatus according to claim 5, wherein said auxiliary storage is a permanent storage.

7. Apparatus according to claim 5, wherein said control means consists in a control unit of said data processing system provided with a special subroutine program for testing said working storage.

8. Apparatus according to claim 5, wherein said control means consists in a special control generator or microprocessor supplying a special subroutine program, possibly under control of timing signals from said data processing system.

* * * * *